United States Patent
Zhang et al.

(10) Patent No.: US 7,533,363 B2
(45) Date of Patent: May 12, 2009

(54) SYSTEM FOR INTEGRATED CIRCUIT LAYOUT PARTITION AND EXTRACTION FOR INDEPENDENT LAYOUT PROCESSING

(75) Inventors: Youping Zhang, Fremont, CA (US); Weinong Lai, Fremont, CA (US)

(73) Assignee: Takumi Technology Corporation, Santa Clara, CA (US)

( * ) Notice: Subject to any disclaimer, the term of this patent is extended or adjusted under 35 U.S.C. 154(b) by 194 days.

(21) Appl. No.: 11/091,305

(22) Filed: Mar. 28, 2005

(65) Prior Publication Data

US 2005/0216875 A1    Sep. 29, 2005

Related U.S. Application Data

(60) Provisional application No. 60/557,727, filed on Mar. 29, 2004.

(51) Int. Cl.
*G06F 17/50* (2006.01)
(52) U.S. Cl. .................. 716/19; 716/8; 716/9; 716/20; 716/21; 430/5; 430/30
(58) Field of Classification Search ............. 716/19–21, 716/8–11; 430/5, 30
See application file for complete search history.

(56) References Cited

U.S. PATENT DOCUMENTS

| | | | |
|---|---|---|---|
| 5,538,815 A * | 7/1996 | Oi et al. ................... | 430/5 |
| 5,858,580 A | 1/1999 | Wang et al. | |
| 6,077,310 A * | 6/2000 | Yamamoto et al. ........... | 716/19 |
| 6,505,327 B2 * | 1/2003 | Lin ............................ | 716/5 |
| 6,560,766 B2 | 5/2003 | Pierrat et al. | |
| 6,721,928 B2 * | 4/2004 | Pierrat et al. ............... | 716/19 |
| 6,807,661 B2 | 10/2004 | Soper | |
| 6,813,758 B2 | 11/2004 | Aleshin et al. | |
| 7,155,440 B1 * | 12/2006 | Kronmiller et al. ......... | 707/100 |
| 2002/0152454 A1 | 10/2002 | Cote et al. | |

* cited by examiner

*Primary Examiner*—Jack Chiang
*Assistant Examiner*—Nghia M Doan
(74) *Attorney, Agent, or Firm*—Hall Estill; William C. Milks, III (57) ABSTRACT

A system and method for integrated circuit design layout processing are disclosed to partition and extract the layout and optimize settings individually for an optimal solution to provide manufacturability enhancement. The integrated circuit design layout system and method are provided for splitting an integrated circuit layout into independent portions or pieces, which can be processed independently and reassembled together, based on prior information about the layout itself, or predefined data processing flow, which are commonly available at the time of processing individual layouts. The integrated circuit design layout system and method split the layout based on hierarchal geometry segregation rules that are derived from the layout data information or data processing flow.

34 Claims, 12 Drawing Sheets

SYSTEM FOR INTEGRATED CIRCUIT LAYOUT PARTITION AND EXTRACTION FOR INDEPENDENT LAYOUT PROCESSING

CROSS-REFERENCE TO RELATED PATENT APPLICATION

This application relates to U.S. Provisional Patent Application No. 60/557,727, filed on Mar. 29, 2004, entitled SYSTEM FOR INTEGRATED CIRCUIT LAYOUT PARTITION AND EXTRACTION FOR INDEPENDENT LAYOUT PROCESSING.

BACKGROUND OF THE INVENTION

1. Field of the Invention

The present invention relates generally to a system and method for designing integrated circuits fabricated by a semiconductor manufacturing process and, more particularly, to a system and method for integrated circuit layout partition and extraction for independent layout processing used in designing integrated circuits to enhance manufacturability and, hence, yield of a semiconductor fabrication process used to produce the integrated circuits.

2. References

U.S. Pat. No. 5,858,580
U.S. Pat. No. 6,505,327 B2
U.S. Pat. No. 6,560,766 B2
U.S. Pat. No. 6,807,661 B2
U.S. Pat. No. 6,813,758 B2
U.S. Published Patent Application 20020152454

3. Description of the Prior Art

The semiconductor manufacturing industry is continually evolving semiconductor device designs and fabrication processes and developing new processes to produce smaller and smaller geometries of the designs being manufactured, because smaller semiconductor devices typically consume less power, generate less heat, and operate at higher speeds than larger devices. Currently, a single integrated circuit chip may contain over one billion patterns. Consequently, integrated circuit designs and semiconductor fabrication processes are extremely complex, since hundreds of processing steps may be involved. Occurrence of a mistake or small error at any of the design or process steps may necessitate redesign or cause lower yield in the final semiconductor product, where yield may be defined as the number of functional devices produced by the process as compared to the theoretical number of devices that could be produced assuming no bad devices.

Improving time-to-market and yield is a critical problem in the semiconductor manufacturing industry and has a direct economic impact on the semiconductor industry. In particular, a reduced time-to-market and higher yield translate into earlier availability and more devices that may be sold by the manufacturer.

Semiconductor integrated circuit (IC) design and manufacturing processes have become increasingly challenging with each new technology node. Classically, the communication of IC requirements between design and manufacturing has been enabled through a set of global and comprehensive design rules. However, with the emergence of sub-wavelength photolithography, the nonlinearity of the pattern transfer process onto semiconductor material such as silicon has increased dramatically. Due to this phenomenon, the effectiveness of the conventional IC design methodology has been significantly decreasing.

Considered in more detail, modern IC design layout data are becoming larger and larger with decreasing feature sizes and increasing complexity of physical layouts. With system on chip (SoC) design, a single IC design can contain multiple types of designs including SRAM, standard cells, random logic, analog, etc., which all have different physical characteristics and also different manufacturing requirements.

Known commercially available techniques for partition or extraction of an IC design layout include brute force division (rectangular mesh), as well as instance- or cell-based division. Clustering-based techniques as described in U.S. Published Patent Application 20020152454 or space-separation-based split techniques as described in U.S. Pat. No. 6,813,758 B1 are also known. However, as the design layout becomes more dense or a layout is compacted, the ability to apply conventional partitioning techniques, for example, to form clusters or achieve space separation, is becoming more difficult and frequently does not yield desirable layout data partitions.

On the other hand, IC design layouts require more and more post-design processing for enhanced manufacturability, typically in the form of resolution enhancement techniques (RET) including optical proximity correction (OPC), sub-resolution assist features (SRAF), and phase-shifting masks (PSM), as well as layout modifications including via doubling, wire spreading, and compaction. The increasing size and complexity of IC design layouts with the growing demand for post-design RET have created a bottleneck for transferring design to manufacturing with a fast product introduction and turn around. Due to the size of the IC design layout, the requirement for hardware and software, including software capacity, hardware memory, processing power, etc., is becoming more demanding.

As the feature size decreases, distortion in the pattern transfer process becomes more severe. The design shapes must be modified in order to print the desired images on the wafer. The modifications account for limitations in the optical lithography process. In the case of OPC, modifications of the design image account for optical limitations as well as mask fabrication limitations and resist limitations. Modifications of the design image can also account for the subsequent process steps like dry etching or implantation. It can also account for flare in the optical system, as well as pattern density variations. Another application of proximity effect correction is the compensation of the effects of aberrations of the optical system used to print the image of the mask onto the wafer. In this case, a mask with aberration correction would be dedicated to a given lithography tool as the aberrations are tool-specific.

Figure 1:
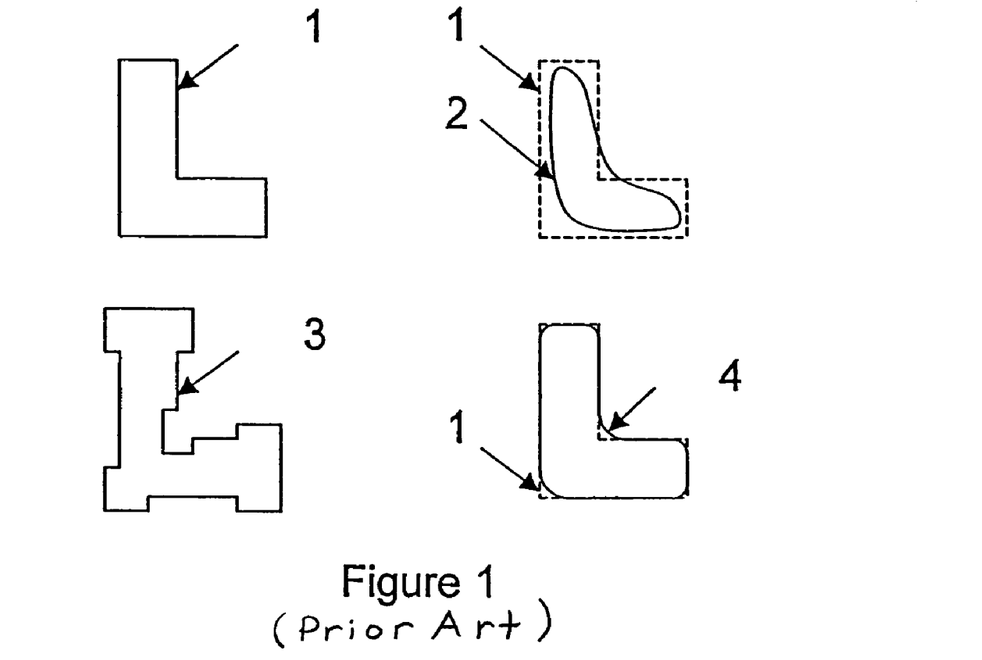
FIG. 1 illustrates modification of IC design layout data to correct proximity effects.

FIG. 1 illustrates the modification of the mask data to correct for proximity effects. The processing of the mask data starts with a target layout 1 representing the desired dimensions of the image on the wafer. The printed image 2 of the target layout 1 differs from the desired image due to proximity effect. For reference, the target image 1 is shown with the printed image 2. The edges of the features are then moved (3) so that the corresponding printed image on the wafer 4 is correct (as close to the target as possible). In FIG. 1, all the areas of the layout have been corrected, but different degrees of proximity effect correction aggressiveness can be applied to different regions depending on the criticality of the region in the integrated circuit.

The corrections to layout 1 can be applied using a rule-based approach or a model-based approach. For a rule-based approach (rule-based OPC, or ROPC), the displacement of the segments would be set by a list of rules depending, for example, on the feature size and its environment. For a model-based approach (model-based OPC, or MOPC), the printed image on the wafer would be simulated using a model of the pattern transfer process. The correction would be set such that the simulated image matches the desired wafer image. A combination of rule-based OPC and model-based OPC, sometimes referred to as hybrid OPC, can also be used.

Figure 2:
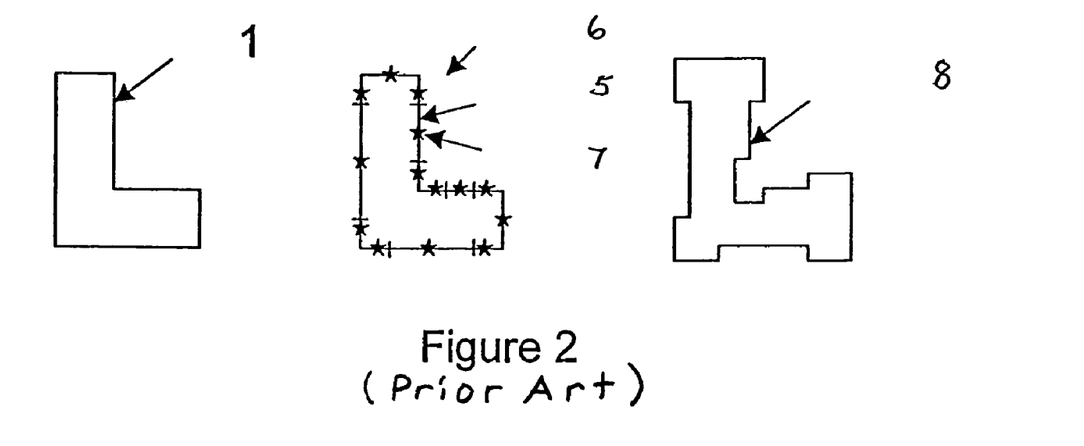
FIG. 2 illustrates the process flow used for model-based optical proximity correction (OPC)

In the case of model-based OPC, the original layout 1 as shown in FIG. 2 is dissected in smaller segments 5 shown in modified layout 6. Each segment is associated with an evaluation point 7. The printed errors of the evaluation points are compensated by moving the corresponding segment in a direction perpendicular to the segment as shown in the final layout 8. The segments are corrected using multiple iterations in order to account for corrections of neighboring segments.

The image quality can be improved by adding printing or non-printing sub-resolution assist features along the edges of the main features. These assist features modify the diffraction spectrum of the pattern in a way that improves the printing of the main feature. The practical implementation of assist features is enhanced with the use of proximity effect correction as described above to correct for any optical printing artifact as well as resist and etch artifacts.

The image quality of an IC design layout can also be improved by another RET known as phase-shifting masks as described in U.S. Pat. No. 5,858,580, for example. In this case, at least two different regions are created on the masks corresponding to different phase and transmission of the light either going through these regions (for transparent mask) or reflected by these regions (for reflective mask). The phase difference between the two regions is chosen to be substantially equal to 180 degrees. The destructive interference between adjacent regions of opposite phase creates a very sharp contrast at the boundary between the regions, thus leading to the printing of small features on the wafer.

Two main classes of phase-shifting masks are currently in use. For the first class, the amount of light transmitted for transparent masks (or reflected for reflective masks) by one region is only a portion of the light transmitted (or reflected) by the other region, typically 5% to 15%. These masks are referred to as attenuated phase-shifting masks or half-tone phase-shifting masks. In some implementations of attenuated phase-shifting masks, some opaque regions (for transparent masks) or non-reflective regions (for reflective masks) are defined on the mask in order to block the light. This type of mask is referred to as a tri-tone mask. For the second class, the light transmitted (for transparent masks) or reflected (for reflective masks) by one region is substantially equal to the light transmitted (for transparent masks) or reflected (for reflective masks) by the other region. The second class of masks includes the following types of phase-shifting masks: alternating aperture phase-shifting masks, chromeless phase-shifting masks, and rim phase-shifting masks. The practical implementation of these techniques is improved with the use of proximity effect correction as described above to correct for any optical printing artifact as well as resist and etch artifacts. All the techniques can be combined with the use of assist features.

Meanwhile, since an IC design layout contains different designs which often require different RET settings and specifications, it is increasingly difficult for a single software tool to be able to accommodate different needs for different types of designs in the same layout. Today's RET tools including OPC, PSM, and design rule check (DRC) tools, for example, can typically be configured only to work globally for a whole layout, whereas the optimal solution may be to localize the layout and optimize settings individually.

Thus, for all these reasons, it would be desirable to provide an IC design layout system and method which overcome the above limitations and disadvantages of conventional systems and techniques and provide a layout partitioning or extraction tool that can split an IC design layout into somewhat independent portions so that they can each be processed independently and optimally to facilitate generation of IC design layouts having improved manufacturability. It is to this end that the present invention is directed. The various embodiments of the present invention provide many advantages over conventional IC design layout systems and techniques.

SUMMARY OF THE INVENTION

One embodiment of the IC design layout system and method in accordance with the present invention provides many advantages over conventional design systems and techniques, which make the IC design layout system and method in accordance with the present invention more useful to semiconductor manufacturers. One embodiment of the present invention provides an IC design layout methodology and a system that partition and extract the layout and optimize settings individually for an optimal solution to provide the benefit of manufacturability enhancement.

Accordingly, one embodiment of the IC design layout system and method in accordance with the present invention provides integrated circuit layout partition and extraction for independent layout processing. The method and system for IC design layout in accordance with one embodiment of the present invention enhance manufacturability of circuit layouts through generation of hierarchical layout partitions which capture localized layout requirements. In contrast to conventional techniques which apply global layout processing, one embodiment of the IC design layout system and method in accordance with the present invention partitions the original design layout based on specified layout/IC properties.

In accordance with the various embodiments of the present invention, an IC design layout system and method are provided for splitting an IC layout into independent portions or pieces, which can be processed independently and reassembled together, based on prior information about the layout itself, or predefined data processing flow, which are commonly available at the time of processing individual layouts. One preferred embodiment of the IC design layout system and method in accordance with the present invention splits the layout based on geometry segregation rules that are derived from the layout data information or data processing flow. The preferred IC design layout system and method do not make any assumptions about the layout, so the IC design layout system and method are universally applicable to any type of layout if, according to the known layout information and data process flow, such segregation exists in the layout. Thus, the IC design layout system and method in accordance with the present invention have many diverse applications.

The foregoing and other objects, features, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figures of the drawing to facilitate an understanding of the present invention. In the figures, like reference numerals refer to like elements. In the drawing:

FIG. 4, comprising FIGS. 4(a) to 4(d), illustrates the dependency of the result of critical data on the result of nearby non-critical data versus the result of non-critical data being dependent on only the nearby critical data itself, but not their processing results;

FIG. 5, comprising FIGS. 5(a) to 5(d), illustrates creating an aggregation and halo range for IC design layout;

FIG. 10, comprising

FIG. 11, comprising FIGS. 11(a) and 11(b), illustrates splitting and recombination of split pieces; and FIG. 12, comprising FIGS. 12(a) to 12(d), illustrates an example of a hierarchal split for an IC design layout in accordance with the present invention.

DETAILED DESCRIPTION OF THE PREFERRED EMBODIMENTS

The present invention is particularly applicable to a computer-implemented software-based IC design layout system, and it is in this context that the various embodiments of the present invention will be described. It will be appreciated, however, that the IC design layout system and method in accordance with the present invention have greater utility, since they may be implemented in hardware or may incorporate other modules or functionality not described herein.

Figure 3:
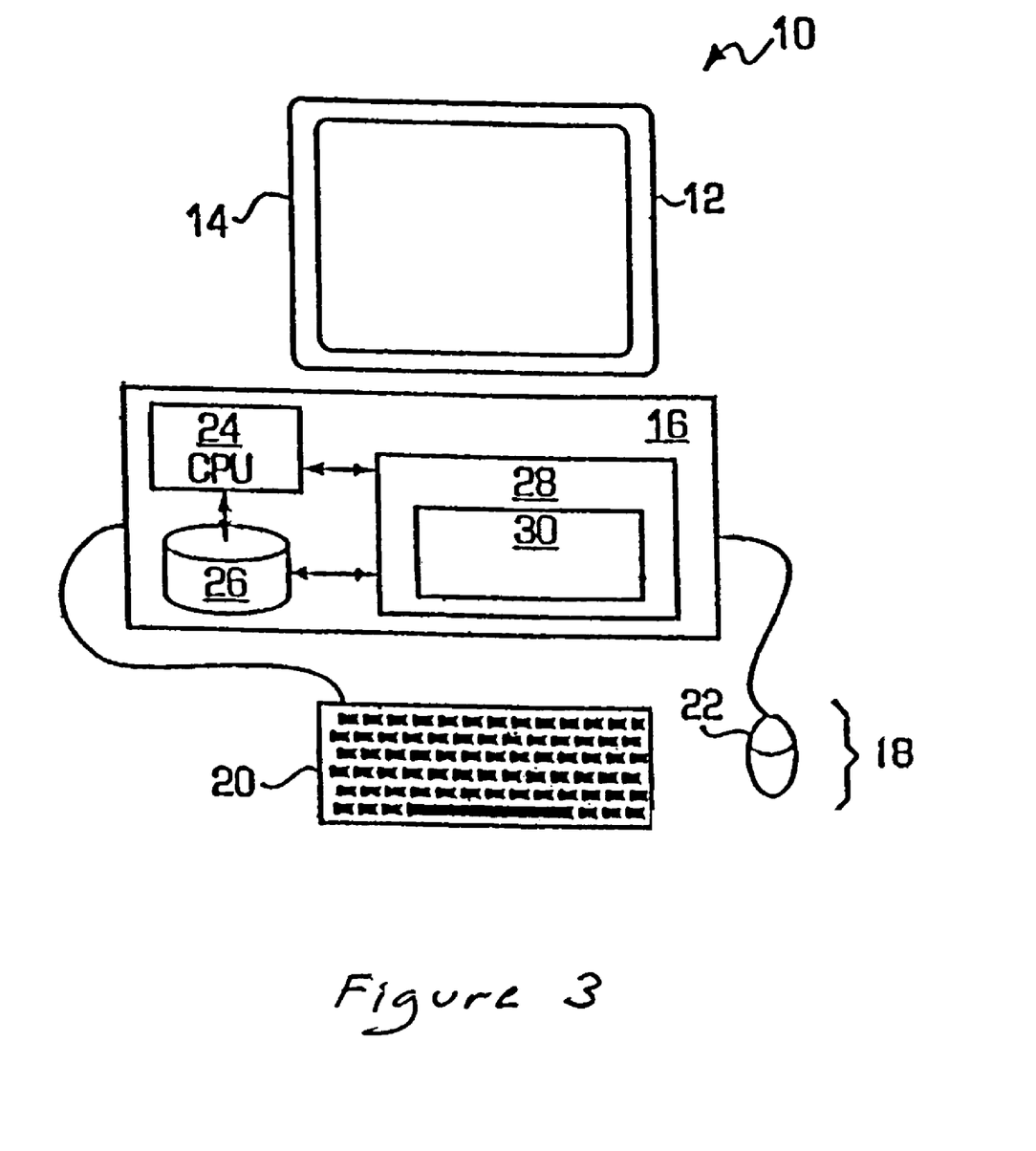
FIG. 3 is a block diagram illustrating an example of an IC design layout system in accordance with one embodiment of the present invention.

FIG. 3 is a block diagram illustrating an example of an IC design layout system 10 in accordance with one embodiment of the present invention implemented on a personal computer 12. In particular, the personal computer 12 may include a display unit 14, which may be a cathode ray tube (CRT), a liquid crystal display, or the like; a processing unit 16; and one or more input/output devices 18 that permit a user to interact with the software application being executed by the personal computer. In the illustrated example, the input/output devices 18 may include a keyboard 20 and a mouse 22, but may also include other peripheral devices, such as printers, scanners, and the like. The processing unit 16 may further include a central processing unit (CPU) 24, a persistent storage device 26, such as a hard disk, a tape drive, an optical disk system, a removable disk system, or the like, and a memory 28. The CPU 24 may control the persistent storage device 26 and memory 28. Typically, a software application may be permanently stored in the persistent storage device 26 and then may be loaded into the memory 28 when the software application is to be executed by the CPU 24. In the example shown, the memory 28 may contain an IC design layout tool 30. The IC design layout tool 30 may be implemented as one or more software modules that are executed by the CPU 24.

In accordance with the present invention, the IC design layout system 10 may also be implemented using hardware and may be implemented on different types of computer systems, such as client/server systems, Web servers, mainframe computers, workstations, and the like. Now, more details of an exemplary implementation of the IC design layout system 10 in software will be described.

Due to the increasing size and complexity of modern IC design layouts and the requirement for specialized treatment for different types of designs in the same layout in design for manufacturability (DFM) applications, it is increasingly advantageous to be able to split the layout into independent pieces which can be processed separately. The split increases flexibility in DFM design and reduces the capacity and processing requirement of the DFM tools.

One embodiment of the present invention provides an IC design layout system and method for processing a design tape-out, e.g., a GDS or OASIS file or a file having another format.

In contrast to a conventional clustering-based split described in U.S. Published Patent Application 20020152454 and the space-based split described in U.S. Pat. No. 6,813,758, the IC design layout system and method in accordance with the various embodiments of the present invention divide the design layout data further by evaluating the "criticality" of data in a layout. For a given data processing step in a data processing flow, data is defined as "non-critical" if the data are not processed in the step, or if the data are processed but the processing result is independent of the possible processing results of the remainder of the data, but possibly dependent on the remainder of the original data. In other words, for any non-critical data that undergo processing, the processing results are identical irrespective of the processing results of the remainder of the data. The data that are not deemed "non-critical" are "critical" data. The critical data not only need to be processed, but their processing results depend on the processing results of the data within a halo range.

Figure 4:
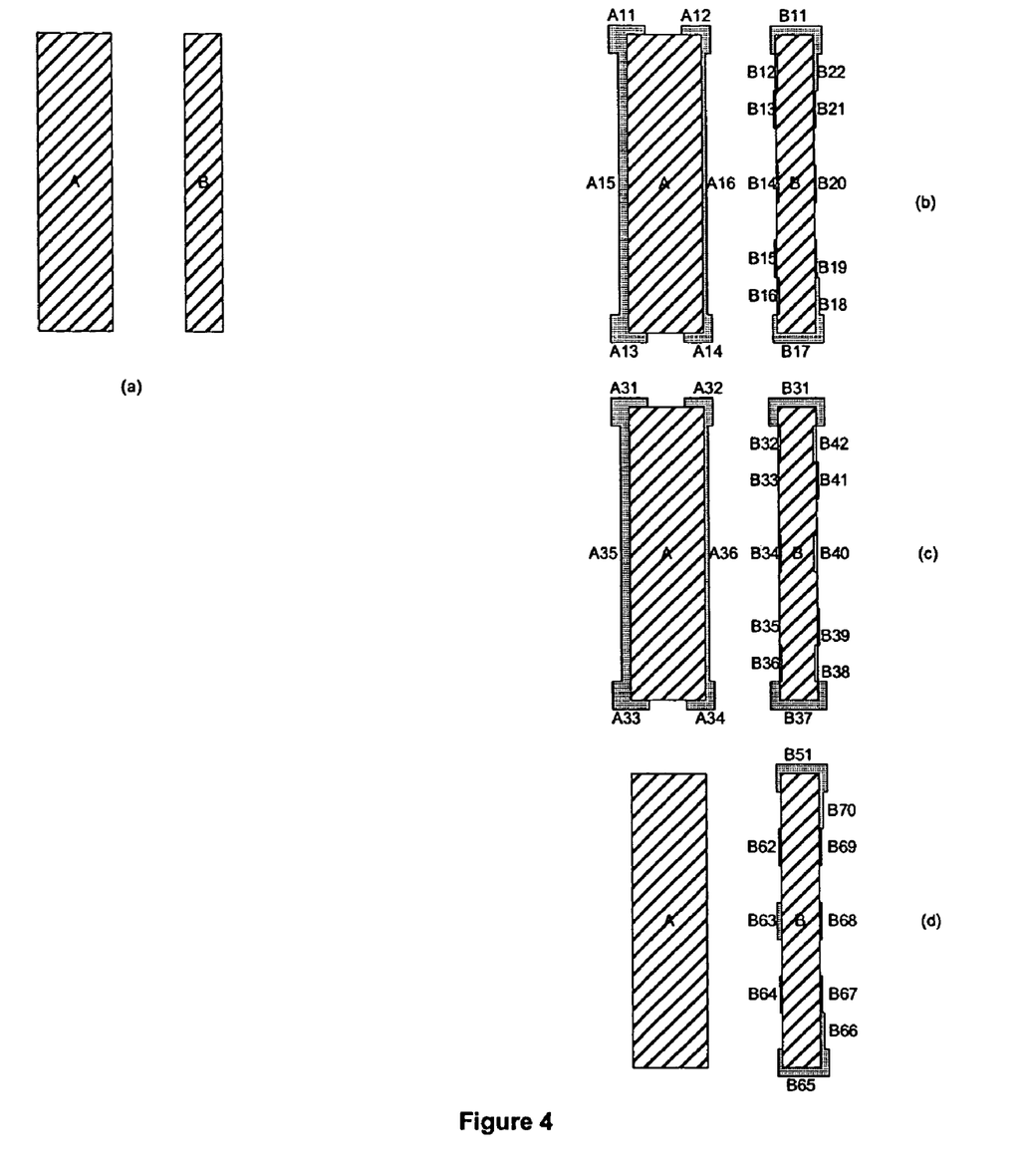

The critical and non-critical data concept may also be illustrated through the OPC example shown in FIG. 4. As shown in FIG. 4(a), geometry A is determined to be corrected with rule-based OPC, and geometry B is determined to be corrected with model-based OPC. The OPC result of geometry A depends on geometry B, but not the processing result of geometry B. FIG. 4(b) and FIG. 4(c) show two possible results. Suppose the results on geometry B are different due to other reasons such as a third geometry (not shown) within proximity range of geometry B, which is not in proximity to geometry A. Even though the two results on geometry B are different, the OPC result on geometry A is identical, because they both depend on the same geometry A and geometry B. On the other hand, geometry B is corrected by model-based OPC, and because of its proximity to geometry of A, the processing results are affected by the processing results of geometry A. Compare FIG. 4(b) and FIG. 4(d), for example, in which FIG. 4(b) shows that geometry A is corrected, and in FIG. 4(d), geometry A is not corrected. As a consequence, the OPC results of geometry B are also different. In this example, geometry A is non-critical data, because they are not processed as in the case of FIG. 4(d), or are processed as in FIG. 4(b) and FIG. 4(c) but the processing results are only dependent on the original geometry B but not its output. On the other hand, geometry B is critical data, because they are processed, and the processing results not only depend on original geometry A, but also on the processing result of geometry A, as shown in FIG. 4(b) and FIG. 4(d).

Figure 5:
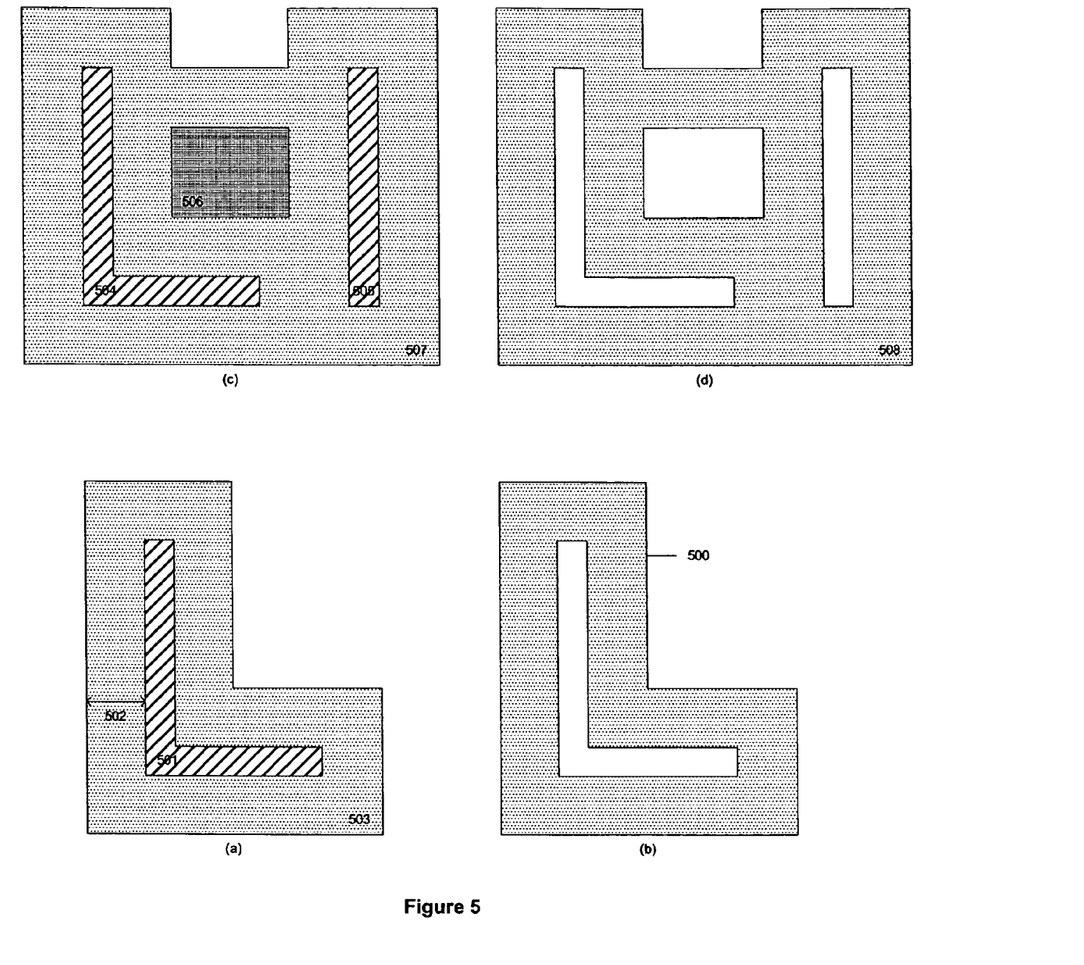

Consider the layout portion shown in FIG. 5(a), which contains one piece or geometries 501. For the geometry 501, a pre-specified halo distance or range determines the neighborhood of the geometry that defines the interact area. Referring to the geometry 501 shown in FIG. 5(a), an interact area 503 around the geometry can be constructed by applying a halo distance 502 around the geometry boundaries. The area with the geometry 501 removed is the halo range 500, as shown in FIG. 5(b). FIG. 5(c) shows the construct of a halo range with multiple geometries. In the example shown in FIG. 5(c), there are three geometries 504, 505, and 506. When a halo distance is applied to each geometry, the resulting interact areas overlap, resulting in a single interact area 507. The characteristic of the multiple geometries (interact area overlap) result in an aggregation of geometries. In the example illustrated in FIG. 5(c), geometries 504, 505, and 506 form an aggregation. The halo range 508 is the resulting interact area with the geometries removed, as shown by FIG. 5(d). An aggregation can contain critical data only, non-critical data only, or a combination of both critical and non-critical data. As shown in FIG. 5(c), geometries 504 and 505 are critical data, and geometry 506 is non-critical data. They combine to form an aggregation that defines a single halo range 508. In principle, data outside the halo range can be segregated from the remainder of the data. Segregated means that one piece of critical data is outside the pre-specified halo range of another piece of critical data. In accordance with the present invention, there can be more than one pre-specified halo range, wherein each pre-specified halo range corresponds to a predetermined piece of critical data.

Figure 6:
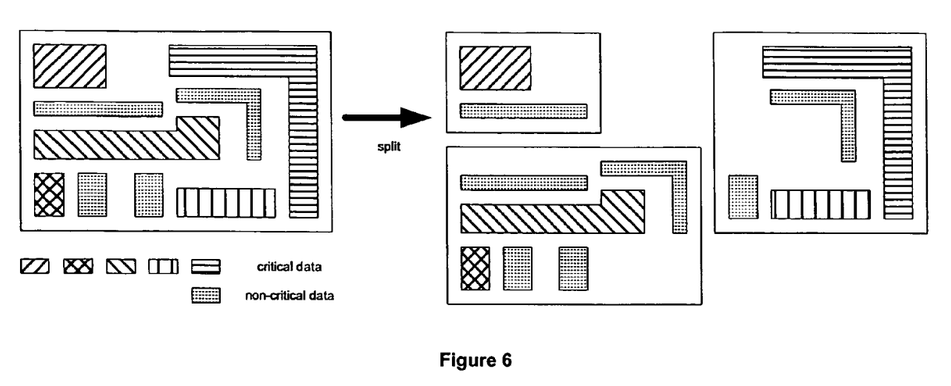
FIG. 6 illustrates a split of an IC design layout in accordance with one embodiment of the present invention.

Accordingly, FIG. 6 shows an example in which there are five pieces of data that are critical that need processing and four pieces of data that are non-critical and require no processing. Consequently, the data may be split into three pieces and processed separately. The non-critical data serve as separation to the critical data. Examples of such non-critical data are dummy patterns or large patterns that do not have printability problems and also are not very important.

Figure 7:
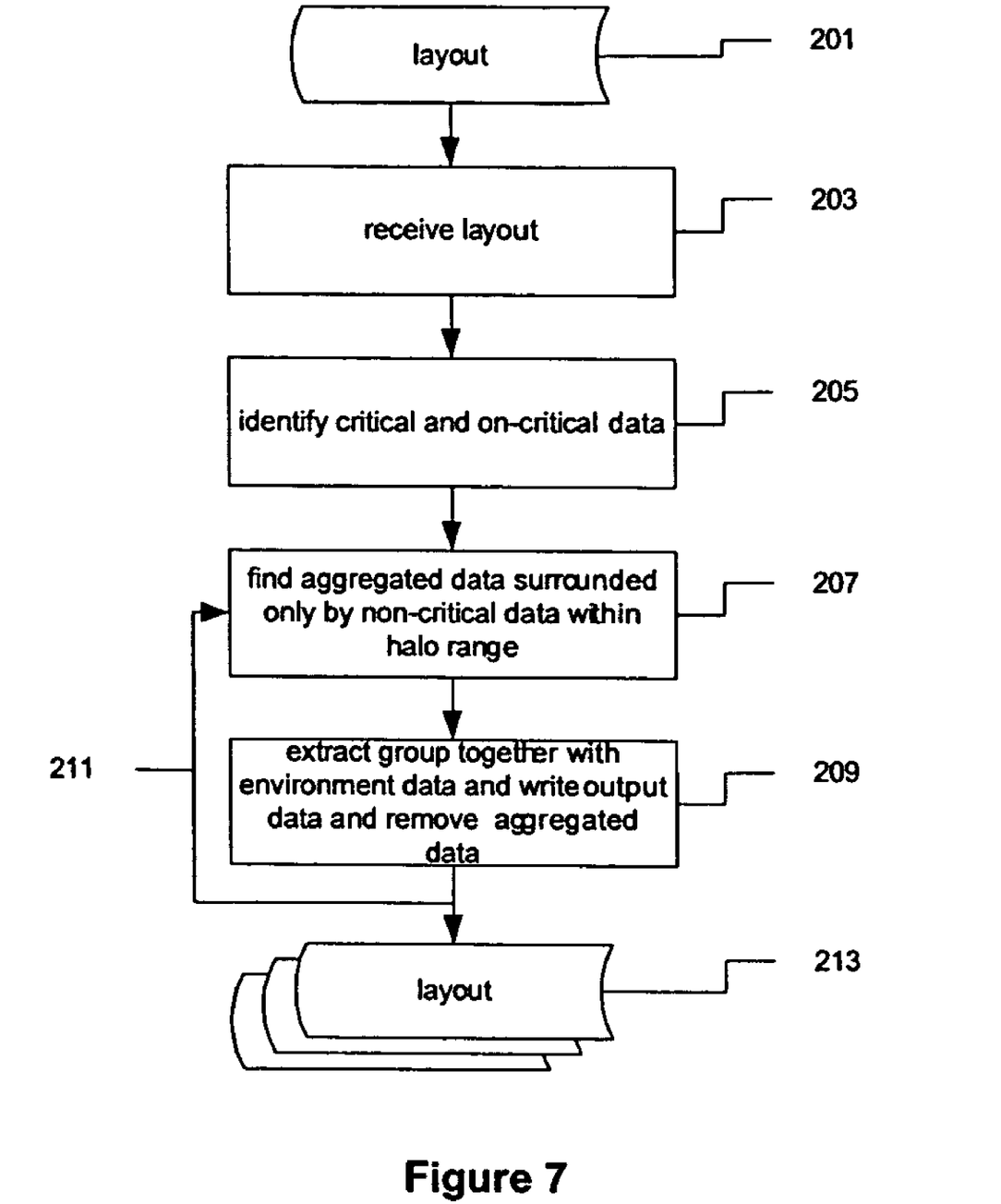
FIG. 7 is a flow diagram illustrating one embodiment of the method for IC design layout in accordance with the present invention for providing a split.

FIG. 7 is a flow chart of one embodiment of the IC design layout method for integrated circuit layout partition and extraction for independent layout processing in accordance with the present invention. First, an IC design layout is provided, as indicated by a step 201 shown in FIG. 7. For example, the data may be in the form of GDSII. The IC design layout is then received, as indicated by a step 203 shown in FIG. 7. Next, critical (e.g., requiring processing) and non-critical (e.g., not requiring processing) data are identified, as indicated by a step 205 shown in FIG. 7. Then, groups of critical data are identified that cannot be separated, which are surrounded by non-critical data within a pre-specified halo range, as indicated by a step 207 shown in FIG. 7. Any such group, together with the relevant environment, are then segregated from the original layout data and written into new layout data, as indicated by a step 209 shown in FIG. 7. As indicated by the branch 211 shown in FIG. 7, the process then continues to search for another group within the remainder of the layout data, until no such additional split may be performed. Finally, the manipulated IC design layout is output, as indicated by a step 213 shown in FIG. 7.

Figure 8:
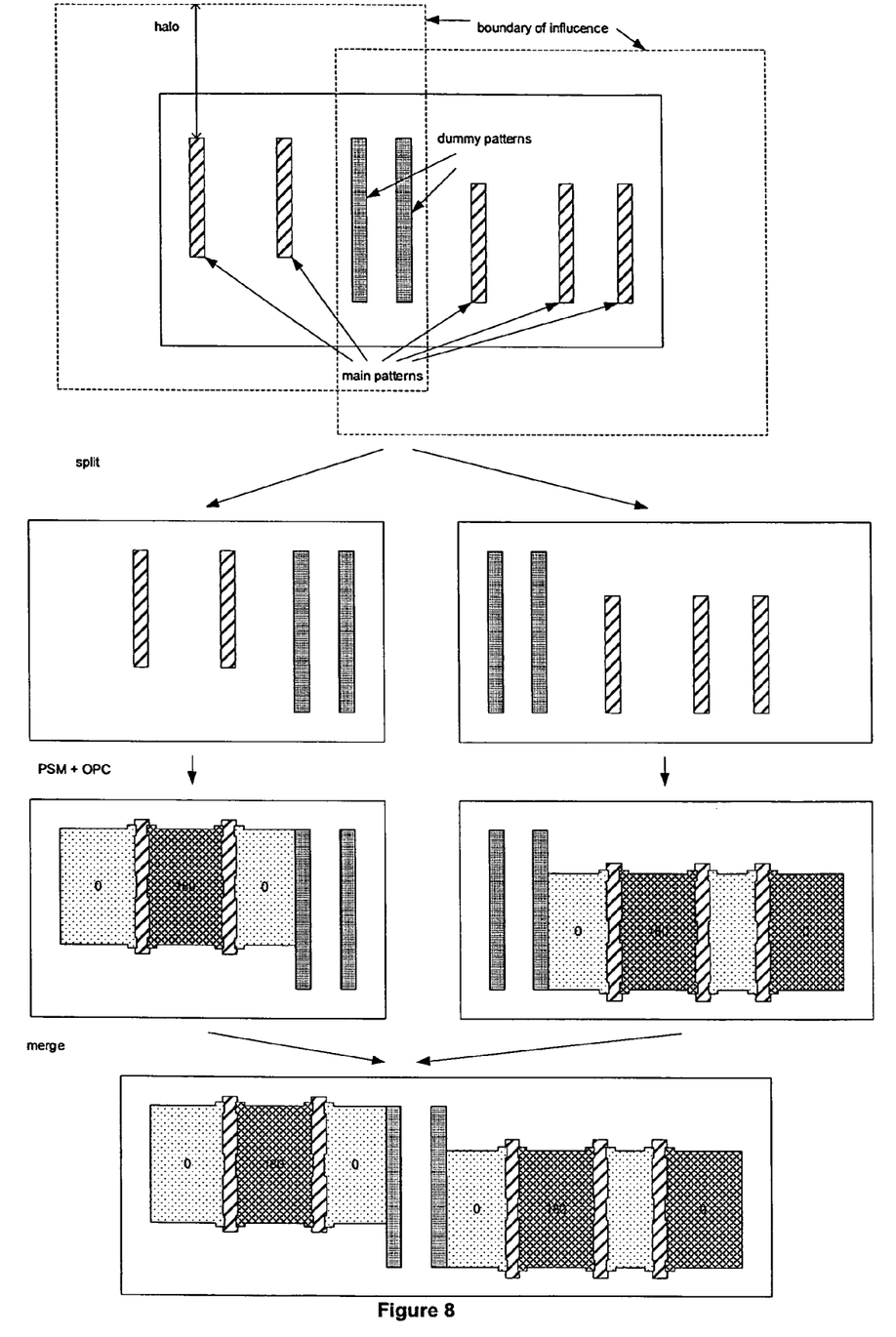
FIG. 8 illustrates an example of a split for an IC design layout for phase-shifting mask (PSM) and OPC processing in accordance with the present invention using dummy patterns as separation from the original layout data.

FIG. 8 illustrates an example in which PSM and OPC are applied to data that are split using dummy patterns as separation from the original layout data. The dummy patterns are non-critical data, because they need no processing irrespective of whether or how the remainder of the layout data are processed. The other five pieces of layout data are critical, because not only are they processed, but their processing results are dependent on each other. The non-critical dummy data segregate the original data into two distinct pieces, based on the pre-specified halo distance. The processing results of the critical data in each group are dependent on each other, but the processing result of one group is independent of the processing result of the other group. These two groups can be split into two pieces. Thereafter, each piece of data is processed by PSM and OPC. Persons skilled in the art will note that the phase shifter placements have affected the dummy patterns. However, the dummy patterns are not important, and the phase shifter effects do not need to be compensated. The two sets of processed data are then merged to produce the final output, as shown in FIG. 8.

Figure 9:
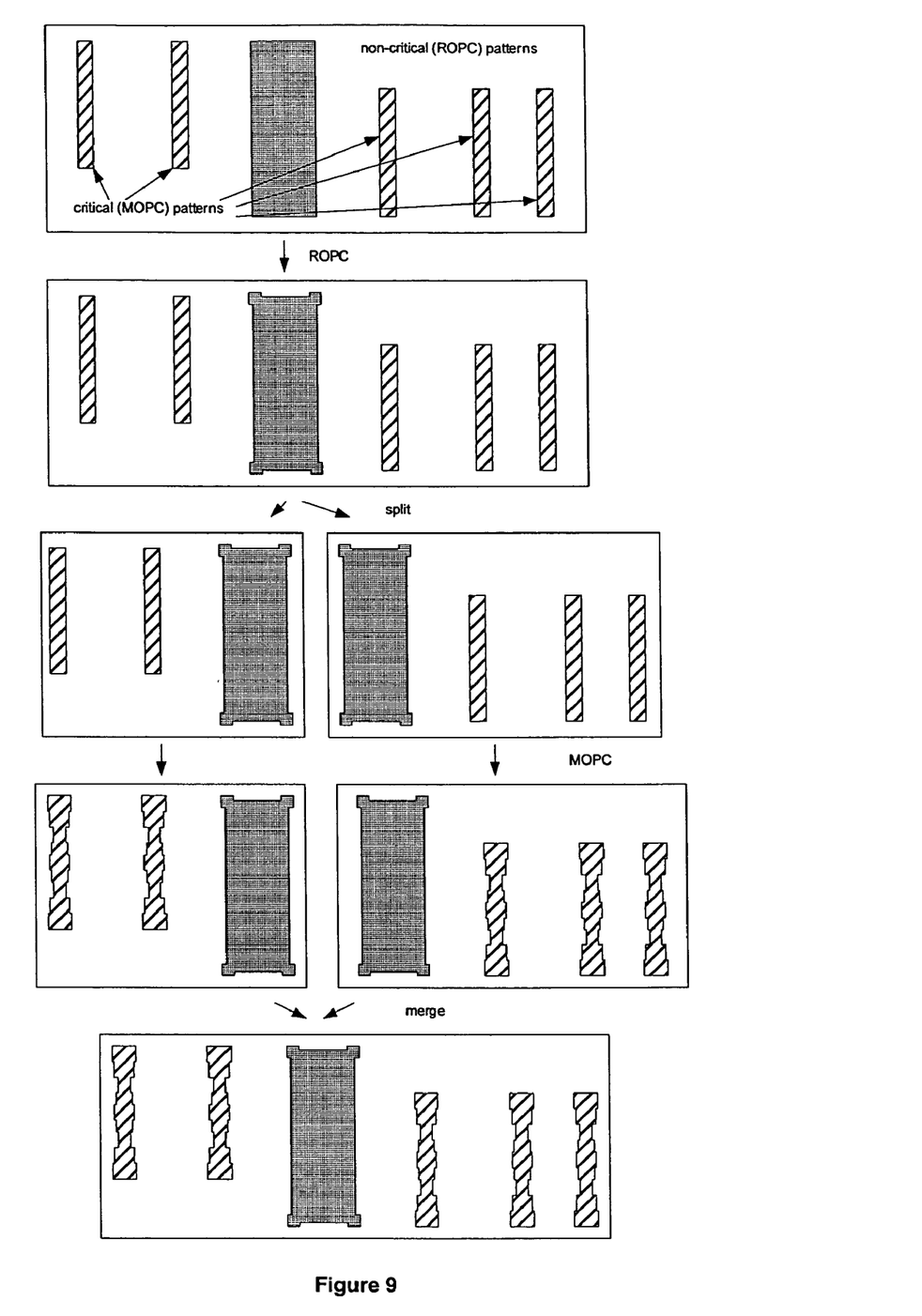
FIG. 9 illustrates another example of a split for an IC design layout for hybrid rule-based OPC and model-based OPC processing in accordance with the present invention.

The segregation need not be provided by dummy patterns. The segregation may be the main patterns that require different processes. FIG. 9 illustrates such an example in which hybrid rule-based OPC and model-based OPC is applied to the main data, in which large patterns need rule-based OPC (ROPC) and smaller patterns require model-based OPC (MOPC). Because rule-based OPC may be applied first and is often much less expensive than model-based OPC, the large pattern may be selected and ROPC applied to the original data. The large geometry is non-critical data, because even though it is processed, it can be processed independently of the OPC output of the remainder of the geometries. That is, OPC can be applied to the large geometry first. The other five pieces are critical data, because they need to undergo model-based OPC which makes their processing output dependent on each other. Using the large pattern processed by ROPC as segregation, the remainder of the critical data can be collected into two groups, where the OPC output of one group is independent of the OPC output of the other group. Therefore, the two groups of data can be split into two distinct pieces, which are each processed by MOPC. Note that the large geometry processed by ROPC is included in both split pieces, because it affects the output of both groups. The results are then merged to produce the final output. Persons skilled in the art will note that this output is identical to the one that would have resulted if MOPC were applied directly to the layout before it is split. However, by splitting the layout, each of the pieces is smaller and, hence, less capacity or processing power is required for the MOPC engine. In addition, by splitting the layout, different MOPC settings may be applied to different pieces, and the results do not affect each other. This is a significant advantage of splitting the layout in accordance with the principles of the present invention.

Figure 10A:
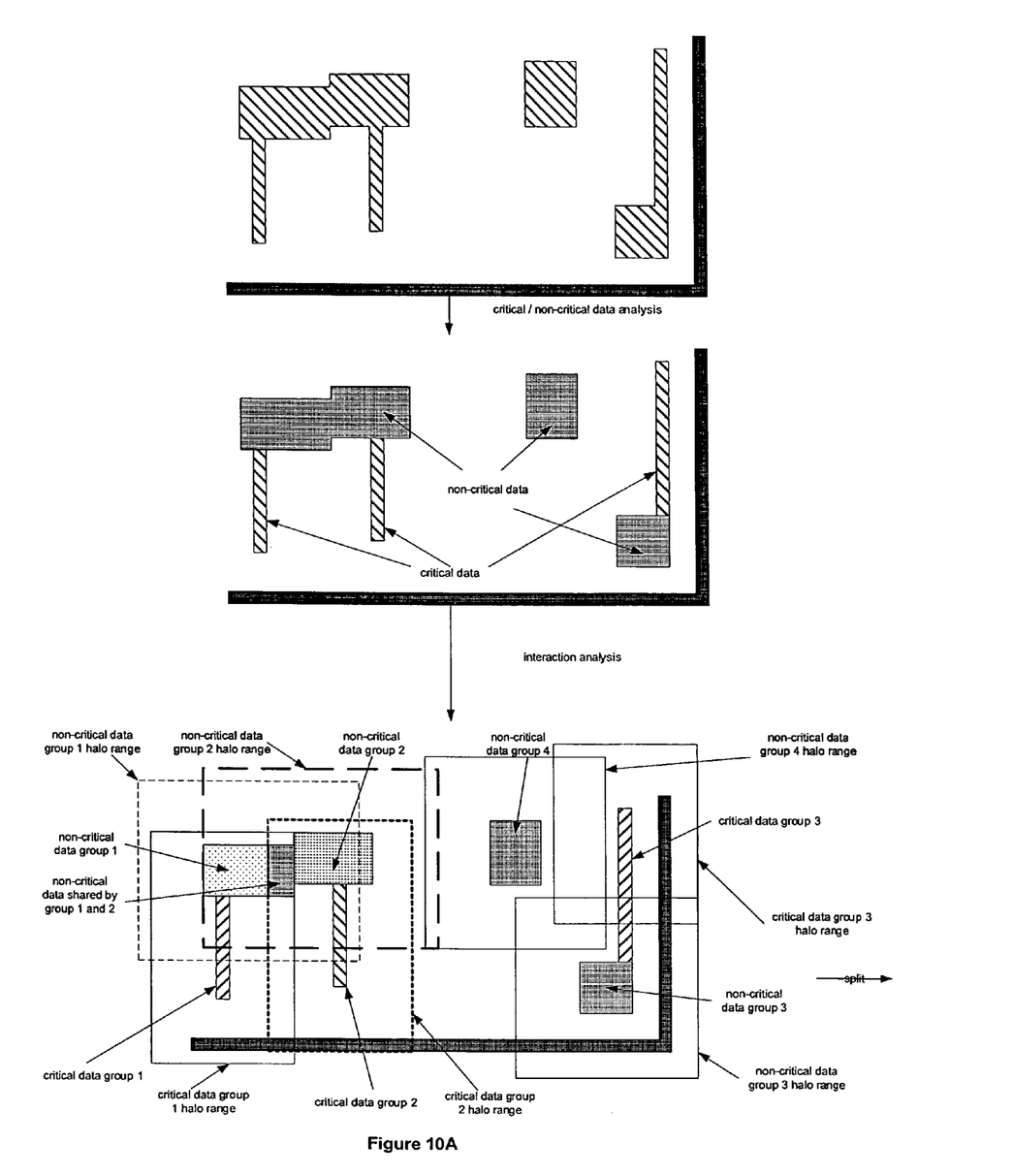
FIGS. 10A and 10B, illustrates a step-by-step example of the identification and processing of critical/non-critical data and the split and merge process for the case of hybrid rule-based and model-based OPC.
Figure 10B:
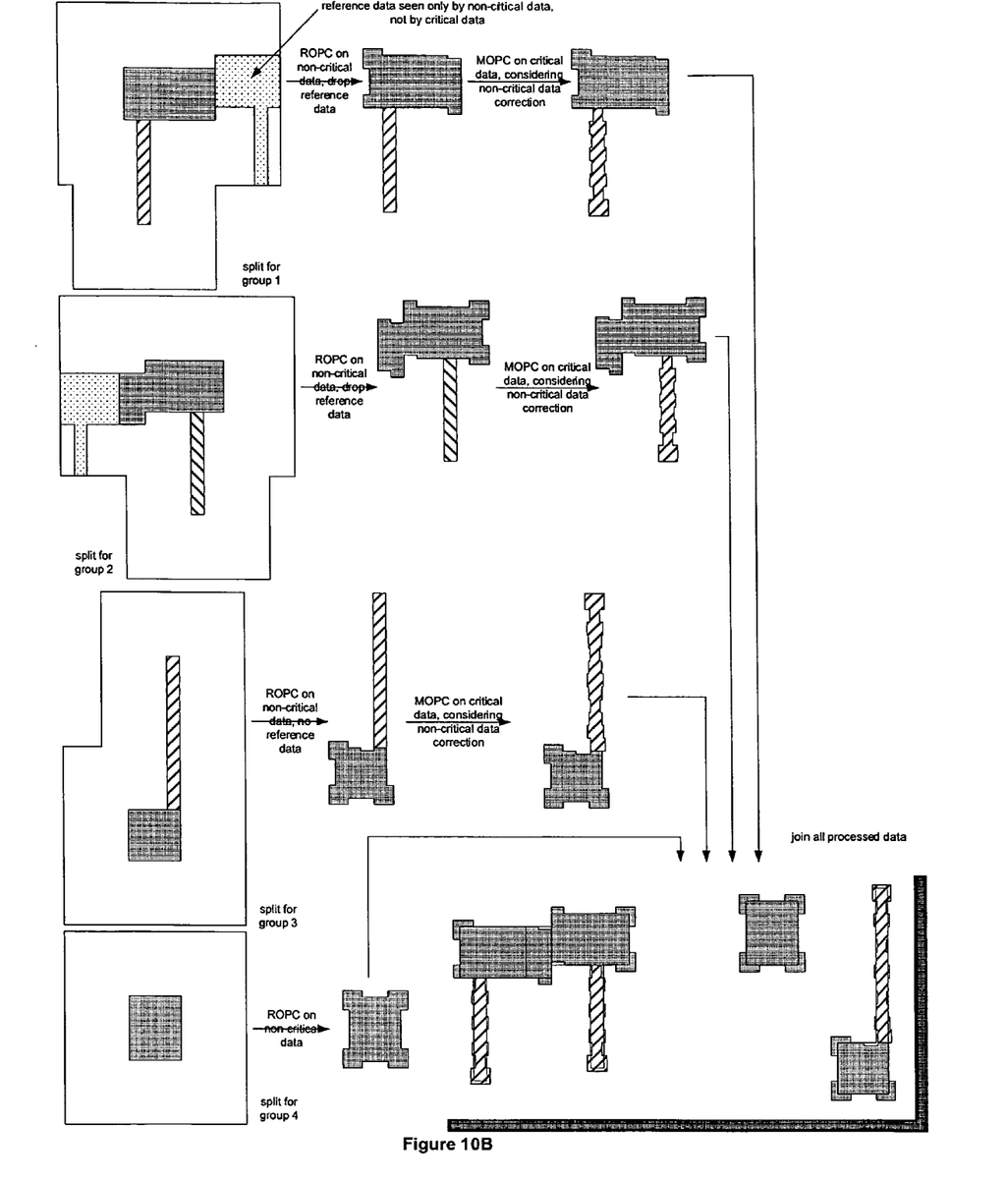

While FIG. 9 shows the example where ROPC is applied to the layout first, then the ROPC output is split and each processed by MOPC, FIG. 10 shows step-by-step examples of the identification and processing of critical and non-critical data and the split and merge processes for the case of hybrid OPC, where the layout is first split and then subsequently ROPC and MOPC are applied. In this example, rule-based OPC is applied to large geometries, and model-based OPC is applied to the remainder. First, the layout data are fractured to segregate the large geometries (grayed) from the thin lines (slashed). The large geometries are non-critical data, whereas the others are critical data. Then, interaction or halo analysis is applied to partition the critical data into three groups (critical data groups 1, 2, 3). Group 1 contains critical data and associated non-critical data within a pre-specified halo range. It also includes reference data (dotted) outside the critical data halo but within the non-critical data halo. The presence of this data does not directly influence the processing of the critical data but is needed to obtain the correct processing results of the non-critical data. This group is split and processed independently. In its processing, first, rule-based OPC is applied to the non-critical data (using the non-critical data and the critical data that are within the halo range of the non-critical data), whereas the critical data are unprocessed. Then, model-based OPC is applied to the critical data based on the OPC result of the non-critical data. Note that the non-critical data is already processed, and, hence, the reference data for the non-critical data are no longer necessary and consequently dropped. Subsequently, the first split is processed independently of the other splits, and the result is ready to be merged into the final output. Critical data group 2 is split and processed in the same manner as the critical data group 1. Critical data group 3 contains one piece of critical data and one piece of non-critical data. There is no non-critical reference data. because there are no other geometries within the pre-specified halo range of the non-critical data, and the non-critical data are the only piece of data that is within the pre-specified halo range of the critical data. During processing, again the non-critical data are first processed, and the critical data are subsequently processed using the processing result of the non-critical data. Finally, non-critical data group 4 contains only one piece of non-critical data and its halo contains no other data. Rule-based OPC is applied to this piece of data independently. Now, all four groups of data are processed, and the results are merged to create the final output. Note that there is a piece of geometry overlap between group 1 and group 2, because this piece of geometry falls into the pre-specified halo ranges of critical data in both groups 1 and 2.

Figure 11:
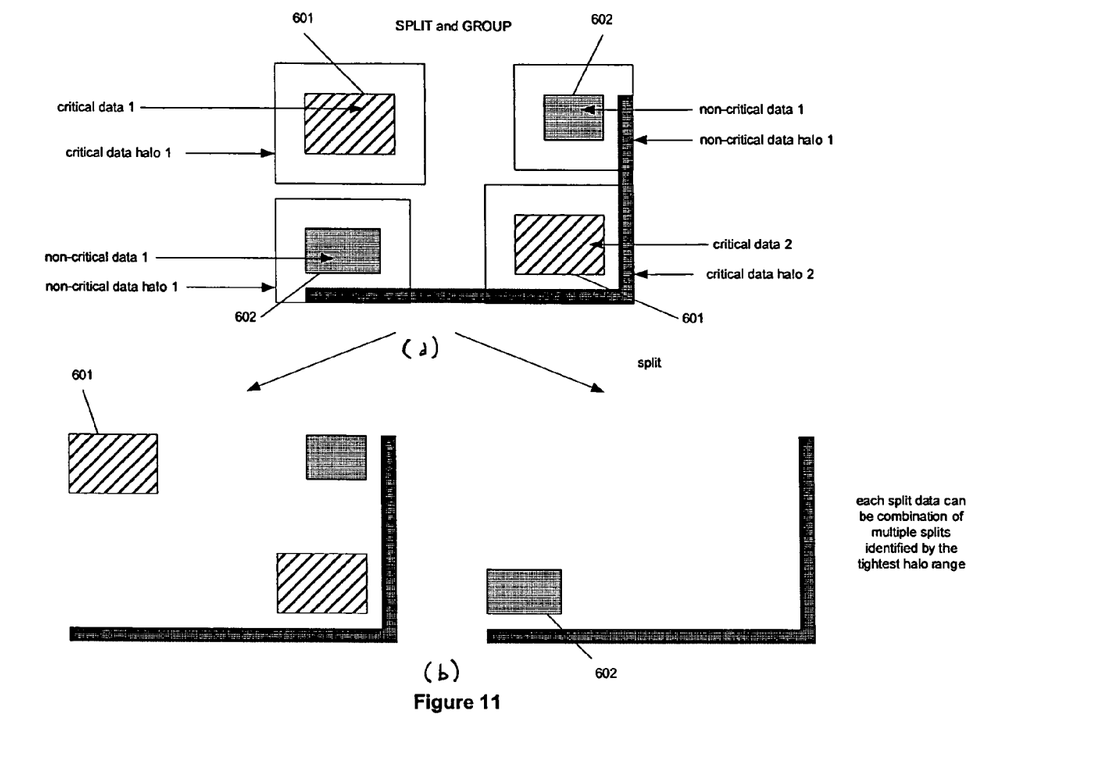

Referring to FIG. 11, there are two pieces of critical data groups 601 and two pieces of non-critical data groups 602 which can result in four splits in total, as shown in FIG. 11(*a*). However, it is possible to split the data into two pieces, one containing two pieces of critical data and one piece of non-critical data, and the other containing only the remaining piece of non-critical data, as shown in FIG. 11(*b*). The four groups of data can be recombined in multiple ways which results in other split scenarios.

Figure 12:
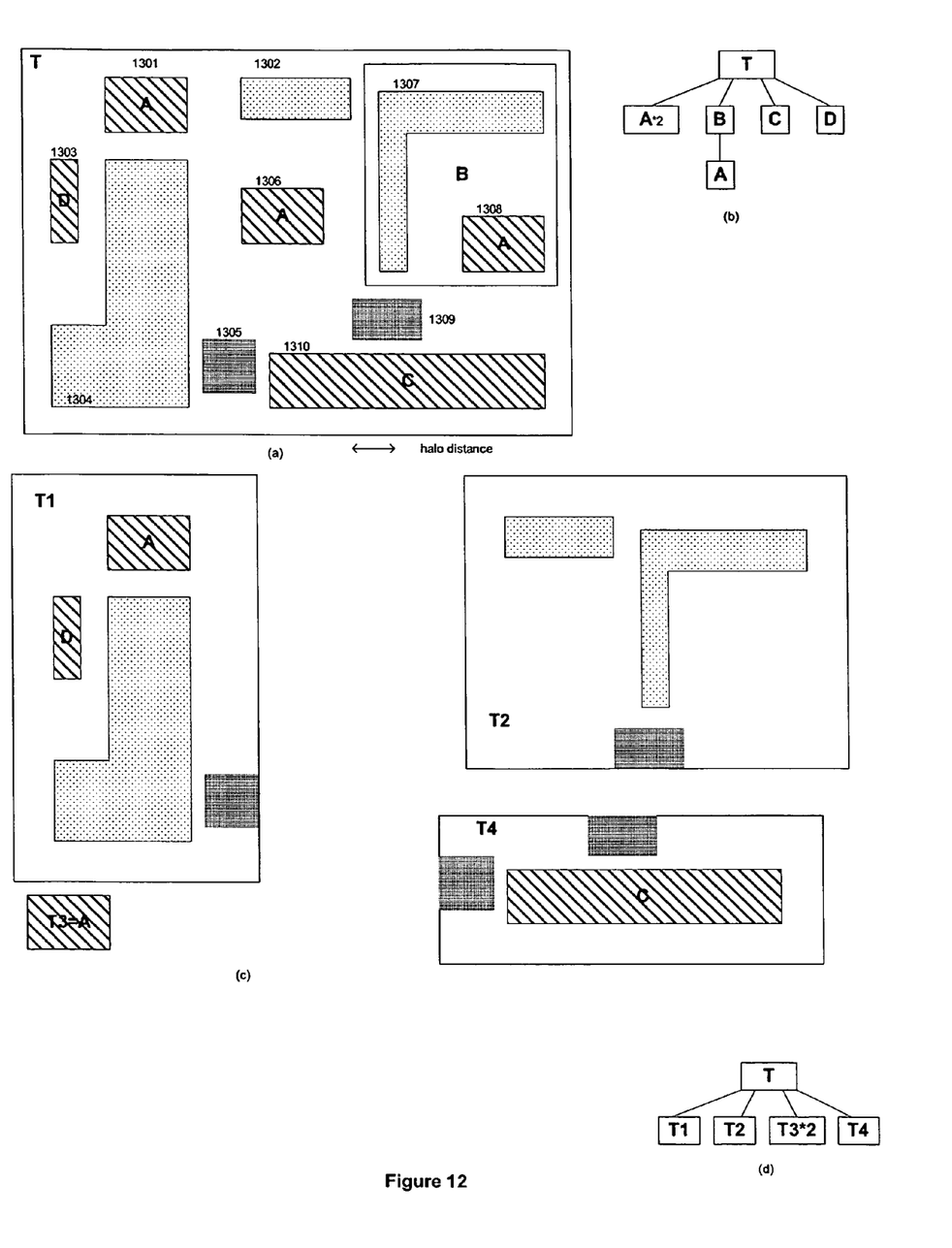

The IC design layout system and method in accordance with one embodiment of the present invention provide a hierarchical split, although the segregation could be anything that the flow defines. For example, as shown in FIG. 12, in accordance with one embodiment of the present invention, the partition or split of the data maintains the hierarchical nature of the input to a maximum extent. Referring to FIG. 12(*a*), assume the layout with root cell T contains two instances of child cell A 1301 and 1306, one instance of child cell B, one instance of child cell D 1303, and one instance of child cell C 1310. In addition, root cell T further comprises other geometry data 1302, 1304, 1305, and 1309. In particular, data 1305 and 1309 are identified to be non-critical. Child cell B further comprises one instance of child cell A 1308 and geometry data 1307. The hierarchical structure is represented in FIG. 12(*b*). The pre-specified halo distance is indicated in FIG. 11(*a*) by the double-headed arrow. With the choice of this distance, four aggregations can be identified, as shown in FIG. 12(*c*). The first aggregation contains cell instance A, cell instance D, and geometry data 1304. Non-critical data 1305 is within the pre-specified halo range of geometry 1304, so this data is included in the first partition, which is referred to as T1. The second aggregation contains geometry data 1302 and 1307. Since non-critical data 1309 is within the halo range of geometry 1307, it is included in the second partition, which is referred to as T2. The third aggregation contains only cell A, which derives from cell instance 1306 and 1308, which has no data within the halo range. Therefore, this partition T3 does not include any additional non-critical data. The last aggregation contains child cell C, and the corresponding partition T4 contains cell C as well as non-critical data 1305 and 1309 that are within the halo range of cell C. Note that cell B has disintegrated as a result of the partitioning.

In accordance with one embodiment of the present invention, the partitions can be physically output into different files for independent processing, and later merged after processing according to their original relative position in the input layout. In another embodiment of the present invention, the partitions may not need to be physically split into separate files. Instead, it can be represented by way of reorganizing the layout hierarchy. In the example, FIG. 12(*d*) shows that the layout hierarchy is altered to reflect the partitioning of the layout. Compared with FIG. 12(*a*), the hierarchy has changed, but the layout they represent is the same. The hierarchy shown in FIG. 11(*d*) is easier to process as it represents topological partitioning of the layout.

While the foregoing description has been with reference to particular embodiments of the present invention, it will be appreciated by those skilled in the art that changes in these embodiments may be made without departing from the principles and spirit of the invention. Accordingly, the scope of the present invention can only be ascertained with reference to the appended claims.

What is claimed is:

1. An IC design layout processing system having computer instructions stored in or on a computer-readable medium to be executed by a processor, the instructions comprising:
   instructions for receiving an IC design layout containing at least two segregated pieces of critical data;
   instructions for enabling a halo range to be pre-specified to determine an interact area between one geometry of the IC design layout and another geometry of said IC design layout for processing the IC design layout;
   instructions for identifying a part of the IC design layout comprising at least one piece of non-critical data such that said piece of non-critical data is within the pre-specified halo range of said at least two segregated pieces of critical data; and
   instructions for processing the critical data and non-critical data that is within the pre-specified halo range of said at least two segregated pieces of critical data, wherein a partition is produced and wherein said at least two segregated pieces of critical data are processed independently from each other; and
   instructions for combining processed data of the IC design layout;
   whereby the non-critical data within the pre-specified halo range of each of said at least two segregated pieces of critical data is processed together with the critical data of each of said at least two segregated pieces of critical data.

2. The IC design layout processing system of claim 1 wherein the instructions further comprise instructions for physically splitting the layout.

3. The IC design layout processing system of claim 2, wherein the instructions for combining processed data of the IC design layout ensure retention of all non-critical data if they are outside the pre-specified halo range of any critical data.

4. The IC design layout processing system of claim 1 wherein the instructions for processing produce a split and further comprising instructions for organizing a hierarchy to reflect the split.

5. The IC design layout processing system of claim 1 wherein the instructions for processing apply rule-based optical proximity correction to non-critical data.

6. The IC design layout processing system of claim 1 wherein the instructions for processing apply model-based optical proximity correction to critical data.

7. The IC design layout processing system of claim 1 wherein the instructions for processing apply rule-based optical proximity correction to all data, partition the data subsequent to rule-based optical proximity correction, and apply model-based optical proximity correction to the partitioned data.

8. The IC design layout processing system of claim 1 wherein the instructions for processing partition the data, apply rule-based optical proximity correction to the partitioned data, and apply model-based optical proximity correction to the data subsequent to rule-based optical proximity correction.

9. The IC design layout processing system of claim 1 wherein the instructions for processing apply phase-shifting masks to the critical data.

10. The IC design layout processing system of claim 1 wherein the IC design layout is a design tape-out in a form of a ODS or OASIS file.

11. The IC design layout processing system of claim 1 wherein there are at least two different pre-specified pieces of critical data having different pre-specified halo ranges.

12. An IC design layout processing method, comprising:
receiving an IC design layout for generating a mask used to fabricate the IC, the design layout containing at least two segregated pieces of critical data;
pre-specifying a halo range to determine an interact area between one geometry of the IC design layout and another geometry of said IC design layout for processing the IC design layout;
identifying a part of the IC design layout comprising at least one piece of non-critical data such that said piece of non-critical data is within the pre-specified halo range of said at least two segregated pieces of critical data;
processing the critical data and non-critical data that is within the pre-specified halo range of said at least two segregated pieces of critical data, wherein a partition is produced and wherein a part of the layout is processed independently from a remainder of the layout; and
thereby processing the non-critical data within the pre-specified halo range of each of said at least two segregated pieces of critical data together with the critical data of each of said at least two segregated pieces of critical data;
combining processed data of the IC design layout; and
generating the mask to fabricate the IC using the combined processed data of the IC design layout.

13. The IC design layout processing method of claim 12 wherein the processing produces a split and further comprising physically splitting the layout.

14. The IC design layout processing method of claim 13 wherein combining processed data of the IC design layout ensures retention of all non-critical data if they are outside the pre-specified halo range of any critical data.

15. The IC design layout processing method of claim 12 wherein the processing produces a split and further comprising organizing a hierarchy to reflect the split.

16. The IC design layout processing method of claim 12 wherein the processing applies rule-based optical proximity correction to non-critical data.

17. The IC design layout processing method of claim 12 wherein the processing applies model-based optical proximity correction to critical data.

18. The IC design layout processing method of claim 12 wherein the processing applies rule-based optical proximity correction to all data, partitions the data subsequent to rule-based optical proximity correction, and applies model-based optical proximity correction to the partitioned data.

19. The IC design layout processing method of claim 12 wherein the processing partitions the data, applies rule-based optical proximity correction to the partitioned data, and applies model-based optical proximity correction to the data subsequent to rule-based optical proximity correction.

20. The IC design layout processing method of claim 12 wherein the processing applies phase-shifting masks to the critical data.

21. The IC design layout processing method of claim 12 wherein the IC design layout is a design tape-out in a form of a GDS or OASIS file.

22. The IC design layout processing method of claim 12 wherein there are at least two different pre-specified pieces of critical data having different pre-specified halo ranges.

23. An integrated circuit design layout system having computer instructions stored in or on a computer-readable medium to be executed by a processor, the instructions comprising:
instructions for providing data representing an IC design layout;
instructions for receiving the IC design layout data;
instructions for enabling a halo range to be pre-specified to determine an interact area between one geometry of the IC design layout and another geometry of said IC design layout for processing the IC design layout;
instructions for identifying critical data and non-critical data;
instructions for identifying groups of critical data which are surrounded by non-critical data within the pre-specified halo range wherein the critical data and non-critical data that are within the pre-specified halo range to be processed together independently from a remainder of the layout;
instructions for segregating one or more groups from original layout data employing the pre-specified halo range, wherein at least one partition is produced, and writing new layout data instructions for manipulating the new data of the IC design layout and combining these data; and
instructions for outputting the manipulated IC design layout data.

24. The system of claim 23 wherein the data representing the IC design layout is a design tape-out in a form of a GDS or OASIS file.

25. The system of claim 23 wherein the instructions for segregating groups search for another group within a remainder of the IC design layout data, split a group located in the search from the remainder of the IC design layout data, and repeat the search and split of the remainder of the IC design layout data, until no additional split may be performed.

26. The system of claim 23 wherein the instructions for segregating produce partitions and further comprising instructions for physically splitting the IC design layout.

27. The system of claim 26, further comprising instructions for combining the output of the split.

28. The system of claim 23 wherein there are at least two different pre-specified groups of critical data having different pre-specified halo ranges.

29. A method for integrated circuit design layout processing, comprising:
providing data representing an IC design layout for generating a mask used to fabricate the IC;
receiving the IC design layout data;

enabling a halo range to be pre-specified to determine an interact area between one geometry of the IC design layout and another geometry of said IC design layout for processing the IC design layout;

identifying critical data and non-critical data and identifying groups of critical data which are surrounded by non-critical data within the pre-specified halo range, wherein the critical data and non-critical data that are within the pre-specified halo range to be processed together independently from a remainder of the layout;

segregating one or more groups from original layout data employing the pre-specified halo range, wherein at least one partition is produced, and writing new layout data manipulating the new data of the IC design layout and combining these data; and outputting the manipulated IC design layout data; and generating the mask to fabricate the IC using the outputted data.

30. The method of claim 29 wherein the data representing the IC design layout is a design tape-out in a form of a GDS or OASIS file.

31. The method of claim 29 wherein the step of segregating groups comprises searching for another group within a remainder of the IC design layout data, splitting a group located in the search from the remainder of the IC design layout data, and repeating the search and split of the remainder of the IC design layout data, until no additional split may be performed.

32. The method of claim 29 wherein the segregating produces partitions and further comprising physically splitting the IC design layout.

33. The method of claim 32, further comprising combining the output of the split.

34. The method of claim 29 wherein there are at least two different pre-specified groups of critical data having different pre-specified halo ranges.

* * * * *